(12) United States Patent
Hiraga (10) Patent No.: US 6,479,869 B1
(45) Date of Patent: Nov. 12, 2002

(54) SEMICONDUCTOR DEVICE WITH ENHANCED PROTECTION FROM ELECTROSTATIC BREAKDOWN

(75) Inventor: Noriaki Hiraga, Yokohama (JP)

(73) Assignee: Rohm Co., Ltd., Kyoto (JP)

( * ) Notice: Subject to any disclaimer, the term of this patent is extended or adjusted under 35 U.S.C. 154(b) by 50 days.

(21) Appl. No.: 09/671,352

(22) Filed: Sep. 27, 2000

(30) Foreign Application Priority Data

Oct. 1, 1999 (JP) ............................................ 11-281212
Oct. 6, 1999 (JP) ............................................ 11-285117

(51) Int. Cl.[7] ............................................... H01L 29/72
(52) U.S. Cl. ....................... 257/350; 257/351; 257/355; 257/360
(58) Field of Search ................................ 257/350, 351, 257/355, 360

(56) References Cited

U.S. PATENT DOCUMENTS 5,717,559 A * 2/1998 Narita ........................ 257/355

FOREIGN PATENT DOCUMENTS

JP  5-160349   6/1993
JP  9-8147     1/1997

* cited by examiner

*Primary Examiner*—Edward Wojciechowicz
(74) *Attorney, Agent, or Firm*—Morgan, Lewis & Bockius LLP (57) ABSTRACT

A semiconductor device is provided that is resistant to electrostatic breakdown by forming active elements for enhancing the protection capability by utilizing a guard ring. A circuit formation region is allocated on one surface of a one-chip substrate. Internal circuits, each surrounded by an associated guard ring are provided in the circuit formation region, and external connection terminals are provided outside the internal circuits. The internal circuits are connected to some of the external connection terminals and power lines. Each of the active elements, which become conductive when a voltage on one of the power lines exceeds a proper operating voltage of the internal circuit, is formed parasitic to the guard ring.

24 Claims, 9 Drawing Sheets

SEMICONDUCTOR DEVICE WITH ENHANCED PROTECTION FROM ELECTROSTATIC BREAKDOWN

This application claims the benefit of Japanese Patent Application No. 11-281212, filed Oct. 1, 1999, and Japanese Patent Application No. 11-285117, filed Oct. 6, 1999, which are hereby incorporated by reference.

BACKGROUND OF THE INVENTION

1. Field of the Invention

The present invention relates generally to a semiconductor device which has internal circuits, wherein each internal circuit is surrounded by an associated guard ring, and more particularly, to a semiconductor device that utilizes guard rings to provide enhanced protection for the internal circuits to prevent breakdown due to electrostatic discharge (ESD) or the like.

Such semiconductor devices, for example, may be typical semiconductor integrated circuit (IC) devices, and more specifically, may include multi-function large scaled integrated (LSI) circuit devices, digital and analog hybrid LSIs, multi-powered digital LSIs, gate affays, custom LSIs, ASICs (application specific IC), and so on.

2. Description of the Related Art

Many ICs are formed with a guard ring that surrounds an internal circuit in order to prevent undesired noise from propagating into the internal circuit, to stabilize a potential state in a substrate and wells, and so on. However, since the guard ring alone tends to be insufficient for ESD protection, short-circuit protection circuits comprised of diodes and so on are often provided on power lines for supplying operating power to the internal circuits for purposes of enhancing the ESD protection for the internal circuits.

Also known are techniques for forming lateral thyristors as an ESD protection circuit provided in IC (see, for example, JP-A-5-160349 and 9-8147).

Conventional devices are disadvantageous in that a short-circuit protection circuit and an ESD protection circuit occupy dedicated semiconductor areas, so that a large area is required for ensuring a sufficient protection capability. For this reason, it is not possible to collectively protect internal circuits, in which a large number of elements are integrated, in the form of a block because there are limitations to the area available for providing protection circuits and the quantity of protection circuits required.

However, since the trend of miniaturization and faster operation of internal circuits is still advancing without limits, and the internal circuits suffer from lower resistance resulting from this trend, sufficient protection can no longer be ensured only by repeating the conventional approaches of increasing the number of protection circuits as mentioned.

Thus, there is a technical problem in the art in creating a semiconductor device structure that is capable of strongly protecting internal circuits from electrostatic breakdown and other harmful effects while at the same time minimizing the area occupied by protection circuits.

SUMMARY OF THE INVENTION

In view of the above problems, a semiconductor device according to the invention is resistant to electrostatic breakdown by utilizing guard rings to form active elements for enhancing the protection capability.

A semiconductor device according to the invention includes a substrate as described below, a plurality of external connection terminals, internal circuits, power lines, guard rings, and active elements for enhancing the protection capability. The substrate is formed in one chip, and has a circuit formation region allocated to one surface thereof Outside the circuit formation region, the external connection terminals are provided. The internal circuits are each connected to some of the external connection terminals and to some of the power lines, and surrounded by a guard ring formed in the region associated with the internal circuit. Further, each of the active elements, which are formed parasitic to the guard ring, is connected to the associated power line such that it maintains a blocking state when a voltage applied from the power line is equal to or lower than a proper operating voltage of the internal circuit associated therewith, and becomes conductive when the applied voltage exceeds the proper operating voltage of the internal circuit before the applied voltage reaches a breakdown voltage of the associated internal circuit.

DETAILED DESCRIPTION OF THE PREFERRED EMBODIMENTS

Reference will now be made in detail to the preferred embodiments of the present invention, examples of which are illustrated in the accompanying drawings.

First Embodiment

A first embodiment of a semiconductor device according to the present invention will be described in terms of its specific structure with reference to FIGS. 1A to 3.

The illustrated semiconductor device (see FIG. 1A) may be a large scaled integrated (LSI) circuit device which includes a substrate 1 made, for example, of p-type silicon or the like and diced into a rectangular shape. On a main surface of the substrate 1, a plurality of external connection elements such as bonding pads 2 or other similar items (for example, Bumps, Balls, Lands, IC Electrodes), external signal input/output circuits, not shown, and internal circuits 6 are arranged in this order from a peripheral region to a central region of the substrate 1.

Figure 1A:
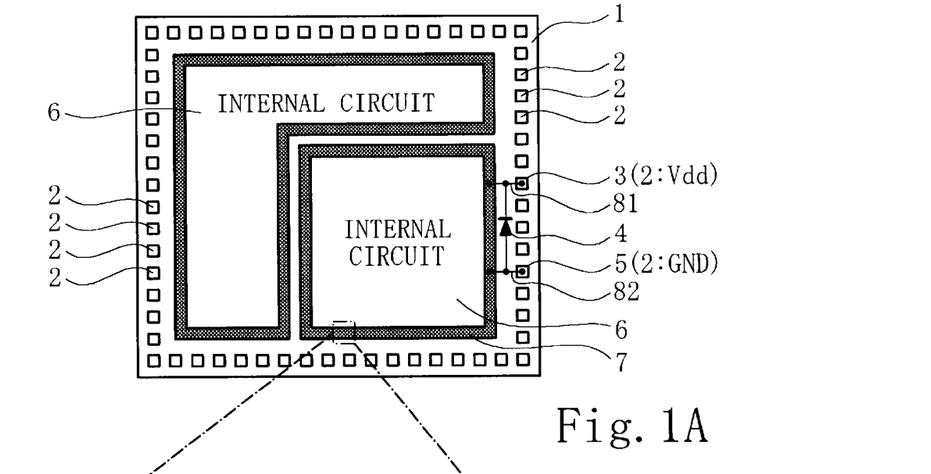
FIG. 1A is a top plan view generally illustrating the layout of a semiconductor device according to a first embodiment of the present invention.
Figure 1B:
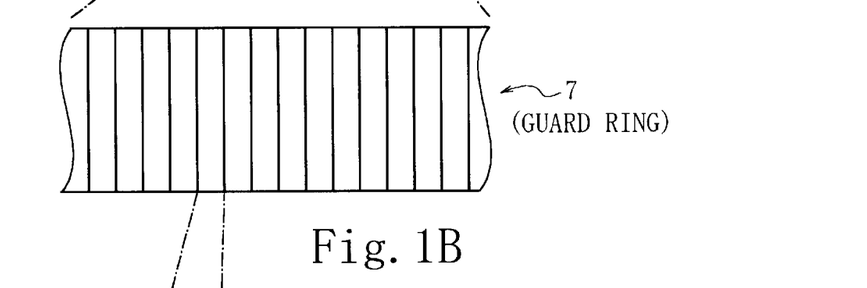
FIG. 1B is an enlarged view of a main portion in the semiconductor device of FIG. 1A.

The internal circuits 6, which may be formed, for example, of miniature CMOS transistors and so on, are blocked as required, according to the independent power systems associated therewith, and are supplied with a respective operating power through power lines routed for each of the blocks.

The power lines routed to the internal circuits 6, as mentioned, are generally comprised of a pair of lines dedicated to current outflow and inflow, or a set of lines including the pairs of lines indicated. More specifically, the pair of lines comprises a power line 81 and a ground line 82, by way of example. Power line 81, one of the lines in the power line pair, is connected to a power supply pad 3 which is assigned from the pads 2 in order to apply a positive voltage (Vdd) from an external power supply. Ground line 82, the other line in the power line pair, is connected to a ground pad 5 selected from the pads 2 for grounding.

The aforementioned external signal input/output circuit is often connected to the power line pair 81+82 for indirect use in bypassing a reversely directed current to prevent the potentials on both lines from being undesirably reversed. A short-circuit protection circuit 4 is explicitly provided for this purpose being connected to the power line pair 81+82.

A guard ring 7 is formed generally around the internal circuit 6 in a loop. The guard ring 7 is generally allocated to or made by using appropriate regions of a substrate (p-type semiconductor in this embodiment) having a predetermined width and high concentration region of the same polarity as the substrate (p+ region in this embodiment). Also, the guard ring 7 has a well region (n-type region in this embodiment) of a predetermined width and a high concentration region of the polarity identical to the well region in the substrate and opposite to the substrate (n+ region in this embodiment), and so on. These regions may extend to form a complete or incomplete annular shape.

Figure 1C:
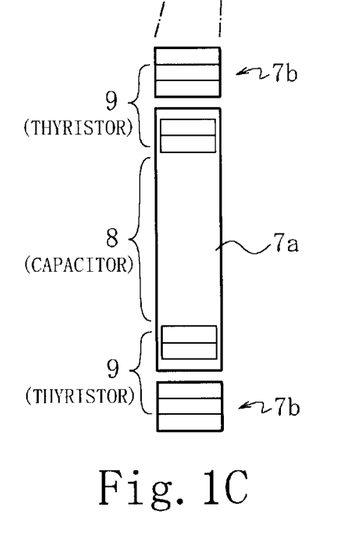
FIG. 1C is an enlarged view of a unit element constituting the semiconductor device of FIG. 1A.
Figure 1D:
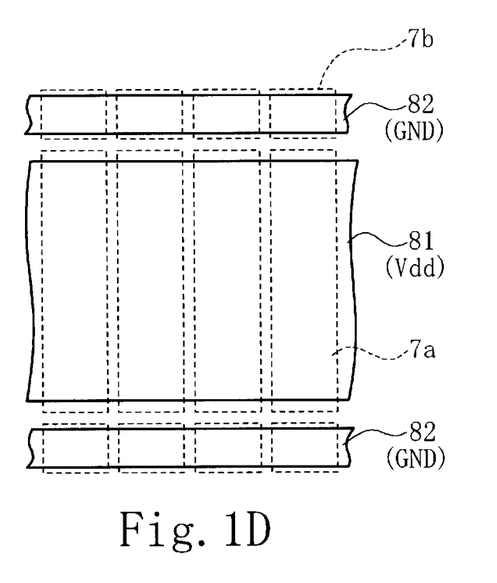
FIG. 1D is a partial view illustrating a wiring pattern overlying the unit element.

The guard ring 7 (see FIGS. 1B and 1C) includes a central wide main guard ring 7a, and narrow sub-guard rings 7b extending along both inner and outer sides of the main guard ring 7a (upper and lower sides in FIG. 1C). These components are collectively subdivided in the longitudinal direction. As a result, the guard ring 7 includes a large number of elongated unit elements in the width direction (the vertical direction in FIG. 1C) arranged in columns in the longitudinal direction. Each of the unit elements is formed with a capacitive element 8 overlying a central portion of the main guard ring 7a for serving as an electrode. Additionally, the unit elements are formed with lateral thyristors 9 (active elements for enhancing the protection capability) overlying both end portions of the main guard ring 7a and the sub-guard rings 7b on both sides thereof in a parasitic manner.

Also, over the guard ring 7 (see FIG. 1D), the power line pair 81+82 run along a similar annular path on an appropriate inter-layer insulating film 84 or the like which intervenes between the power line pair 81+82 and the guard ring 7. More specifically, the power line 81 is formed generally over the main guard ring 7a in a single wide wiring pattern, while the ground line 82 is formed as two lines generally over the two sub-guard rings 7b in narrow wiring pattern. Tree-like or stripe wires branch off from these power line pairs 81+82 at several locations and extend into the internal circuit 6 to supply operating power to a large number of internal circuits and so on from their neighborhood.

Figure 2A:
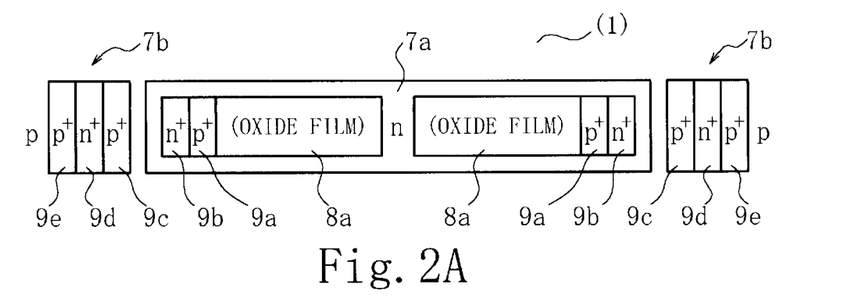
FIG. 2A is a top plan view illustrating in detail the structure of a lower layer in the unit element.
Figure 2B:
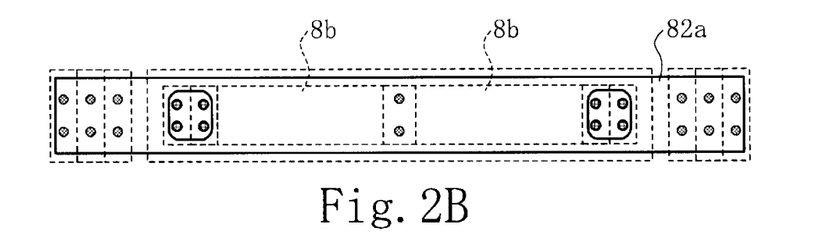
FIG. 2B is a top plan view illustrating in detail the structure of a middle layer in the unit element.
Figure 2C:
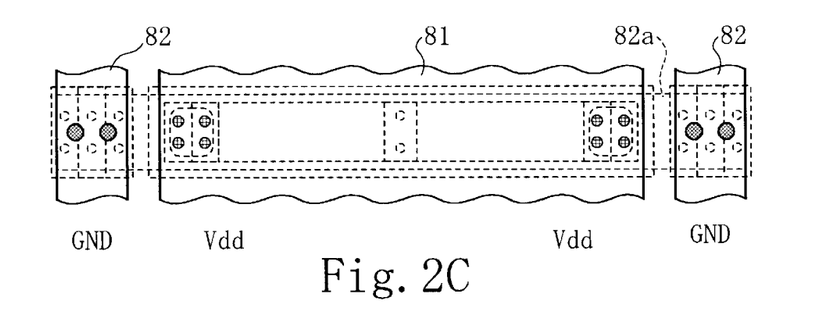
FIG. 2C is a top plan view illustrating in detail the structure of an upper layer in the unit element.

Further, the power line pair 81+82 is connected to the capacitive elements 8 and the lateral thyristors 9 for each unit element (see FIGS. 2A to 2C which illustrate the power line pair 81+82 in a state rotated by 90° from the illustration of FIG. 1C). Specifically describing in detail the formation of the unit elements in the guard ring, the capacitive elements 8, lateral thyristors 9 and connections to the power line pair 81+82 are arranged in columns along the guard ring 7. A well region of n-type semiconductor is formed in the region allocated to the main guard ring 7a within the main surface of the substrate 1, which is a p-type semiconductor region, by a diffusion process or the like. Adjacent high concentration regions 9a, 9b are formed on both ends of the well region by an ion implantation process or the like. Likewise, consecutive high concentration regions 9c, 9d, 9e are formed by an ion implantation process or other like process in a region allocated to the sub-guard ring 7a slightly away from the regions 9a, 9b, with a field oxide film 83 (Insulating Layer) or the like interposed therebetween.

Figure 2D:
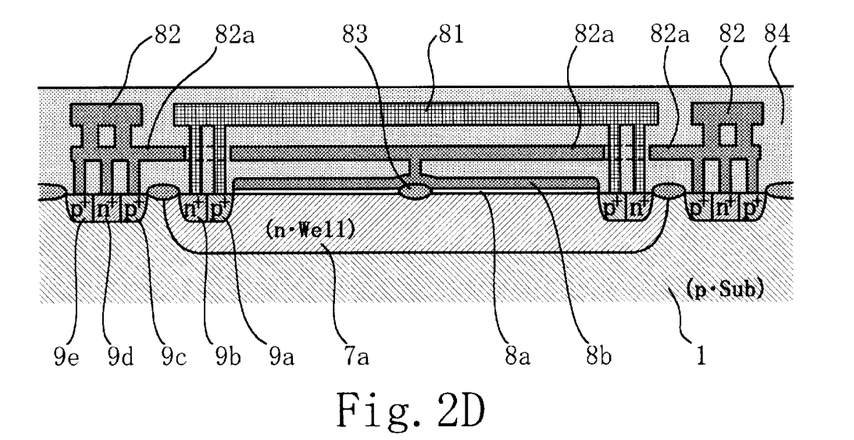
FIG. 2D is a cross-sectional view illustrating in detail the structure of the unit element.

Then, as can be seen in FIGS. 2A and 2D, these high concentration regions 9a–9d form a semiconductor region including a p+ region, an n+ region and an n-well region, a p-substrate and p+ region, and an n+ region in that order in the lateral direction. For these regions, the concentrations of impurities implanted into the respective regions and the mutual distances are appropriately set in designing the semiconductor region to function as a lateral thyristor. The thyristor is activated when a voltage that exceeds a proper supply voltage (Vdd–GND) is applied to it. It should be noted that the addition of the outermost p+ region, i.e., the high concentration region 9e is provided to ensure isolation from the outside.

Referring further to FIGS. 2A and 2D, for forming a gate oxide film for a pMOS transistor which is an internal element in the internal circuit 6. A thin insulating film 8a is formed of the same gate oxide film over a majority of a central portion of the main guard ring 7a. Then, electrode layers 8b are formed by a sputtering process or other like process, immediately overlying the insulating film 8a (see portions surrounded by broken lines in FIG. 2B, and FIG. 2D).

A wiring layer 82a is formed over the electrode layer 8b with an appropriate inter-layer insulating film 84 interposed therebetween (see portions surrounded by solid lines in FIG. 2B, and FIG. 2D).

Wiring layers for the power lines 81, 82 are also formed on an appropriate inter-layer insulating film 84 (see FIGS. 2C and 2D).

Also, patterning associated in the respective processes divides the electrode layer 8b and the wiring layer 82a into unit elements, and separates the power line 81 and the ground line 82 from each other to form them in an annular shape. Contact holes are also formed in the middle of the aforementioned processes by anisotropic etching, metal implantation process, and so on to vertically connect the high concentration regions 9a, 9b to the power line 81, and to vertically connect the high concentration regions 9c, 9d, 9e to the wiring layer 82a and the ground line 82.

With these processes, the connection regions 9a, 9b in each of the unit elements connect the capacitive element 8 and the lateral thyristor 9 to one line 81 of the power line pair.

Similarly, the electrode layer 8b is vertically connected to the wiring layer 82a, in which case, however, the connection is made above the field oxide film 83 for preventing breakdown of the insulating film 8a due to a concentrated current. Furthermore, the connection is located substantially at the center of the main guard ring 7a and the electrode layer 8b with respect to the width direction of the guard ring 7. In this way, the wiring layer 82a extending from the connection of the lateral thyristor 9 with the other line 82 of the power line pair (i.e., an intermediate position between the upper ground line 82 and the lower sub-guard ring 7b) is connected to the capacitive element 8 after passing over the electrode layer 8b of the capacitive element 8.

Figure 3:
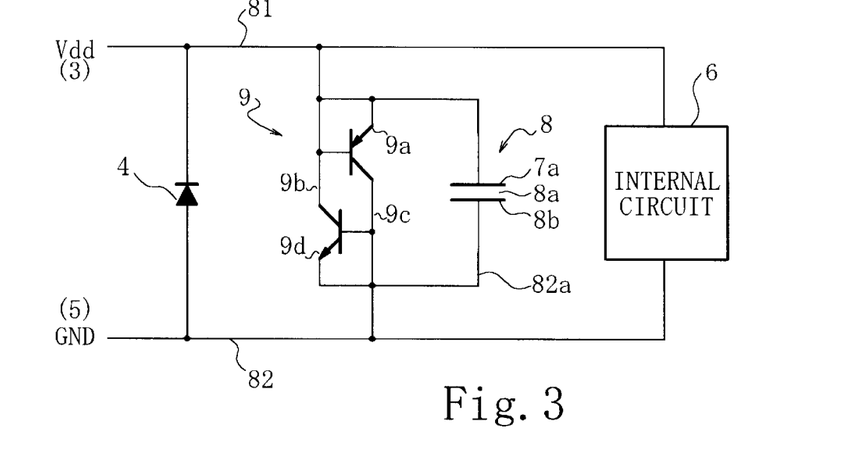
FIG. 3 is an equivalent circuit diagram for the semiconductor device illustrated in FIG. 2D.

Referring now to FIG. 3, the semiconductor device as described is equivalently represented in the illustrated circuit diagram, in which the short-circuit protection circuit 4, the lateral thyristor 9 and the capacitive element 8 are connected, in order from the pads 3, 5 to the internal circuit 6. The power line pair 81+82 is connected to the pads 3, 5. Specifically, the power line pair 81+82 comprise the power line 81 routed from the power supply pad 3 to the internal circuit 6, and the ground line 82 routed from the ground pad 5 to the internal circuit 6.

The capacitive element 8 is also connected to the power line pair 81+82 through the lateral thyristor 9.

Next, the semiconductor device of the first embodiment will be described in terms of its usage and operation.

The semiconductor device as described may be encapsulated in an appropriate plastic package or the like and connected to external power supplies, circuits and so on through 1C pins, or connected through bumps or the like as a bare chip. The semiconductor device is then covered with a resin or the like, for implementation in a variety of different applications and apparatuses. The semiconductor device thus implemented is applied with a positive voltage Vdd at the power supply pad 3 from an external power supply, and has the ground pad 5 connected to the ground in a normal state.

As long as the voltages on the power line pair remain within a proper range, the short-circuit protection circuit 4 will not operate, the lateral thyristor 9 will not become conductive, and the capacitive element 8 functions as a smoothing element to remove any ripple noise or the like. Thus, the voltages are stabilized on the power line pair 81+82, instead of being adversely affected, thereby properly supplying the internal circuit 6 with its necessary power. Since the capacitive element 8 has an increased capacitance due to a reduced thickness of the insulating film 8a, its smoothing ability is also improved.

On the other hand, if one or both of the power supply pad 3 and the ground pad 5 are supplied with an electrostatic discharge causing an abnormal voltage state between the power line pair 81+82, the short-circuit protection circuit 4 will respond first. For example, when the potential difference between the power line pair 81+82 extends beyond the proper range, or when the potentials on the power line pair 81+82 are reversed. A surge current which cannot be absorbed by the short-circuit protection circuit 4 propagates through the power line pair 81+82 to the lateral thyristor 9, causing the same to become conductive allowing a portion of the surge current to pass through. The surge current may also be absorbed temporarily in the capacitive element 8.

The lateral thyristor 9 is actuated first to temporarily prevent a peak voltage of the surge noise from abruptly rising. Thus, the capacitive element 8 will not be broken down even if the insulating film 8a is thin, and the capacitive element 8 absorbs a large amount of surge current. For this reason, the peak voltage of the surge noise is always limited to a low level, so that high voltage surge noise does not reach or seldom reaches the internal circuit 6.

The capacitive elements 8 and the lateral thyristors 9 are formed in an annular shape together with the power line pair 81+82, so that even if an electrostatic discharge is applied to any pad 2 (not limited to pads 3, 5), the surge noise generated by the electrostatic discharge is guided in many cases to another part on the annular power lines 81, 82 through the external signal input/output circuits, protection circuits, etc. Additionally, when surge noise is introduced in a unit element from the lateral thyristor 9 and the capacitive element 8 of the power line pair 81+82, the associated lateral thyristors 9 and capacitive elements 8 sequentially operate from one unit element to another to eliminate the surge noise.

Since the lateral thyristors 9 protects the internal circuit 6 in cooperation with the capacitive elements 8, while also protecting the capacitive elements 8, the internal circuit 6 is effectively protected from surge noise due to electrostatic discharge and so on.

In addition, since the capacitive elements 8 and the lateral thyristors 9 are formed overlying the guard ring 7 together with the power line pair 81+82, no special region is needed exclusively for protection.

Second Embodiment

Figure 4A:
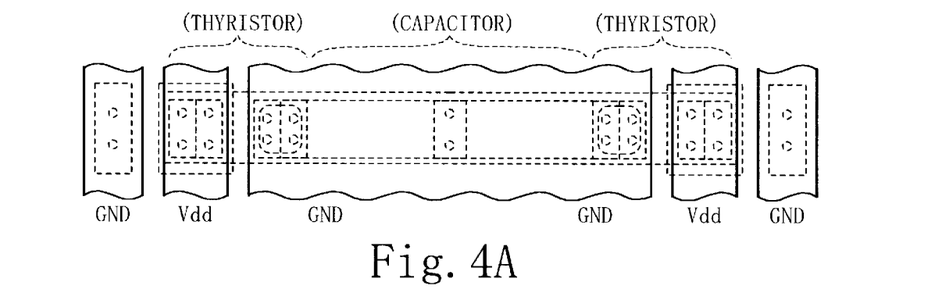
FIG. 4A is a top plan view illustrating in detail the structure of a unit element for a second embodiment of the semiconductor device according to the present invention.
Figure 4B:
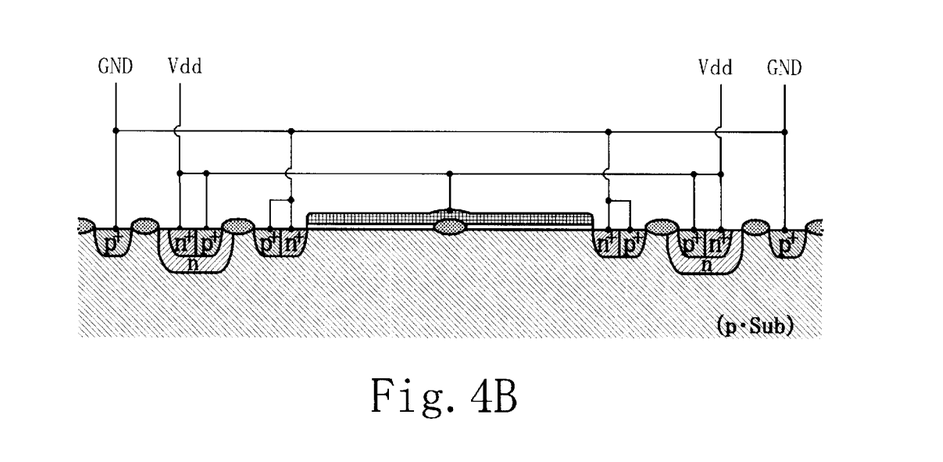
FIG. 4B is a cross-sectional view illustrating in detail the structure of the unit element.

A second embodiment of the semiconductor device according to the present invention will be described in terms of its specific structure with reference to FIGS. 4A and 4B. FIG. 4A corresponds to the aforementioned FIG. 2C, and FIG. 4B to FIG. 2D, wherein illustrations of wiring patterns, etc. correspond to those of the first embodiment and are incorporated herewith. The capacitive element 8 in the first embodiment is similar to a gate structure of a pMOS transistor, whereas a capacitive element in the second embodiment is similar to a gate structure of an nMOS transistor. Specifically, an area allocated to the main guard ring 7a, which is an n-well in the first embodiment, is formed of a p-type substrate in the second embodiment. The polarities of the high concentration regions 9a, 9b are replaced with opposite ones to those in the first embodiment. An n-well is formed around the high concentration regions 9c, 9d. An outer high concentration region 9e is formed separately. Furthermore, voltages supplied to the power line pair 81+82 are also interchanged with each other, so that the power line 82 is applied with the positive voltage Vdd and the power line 81 is grounded. It should be noted that the high concentration region 9e for isolation is maintained as grounded.

With the structure described above, although the voltages and polarities are interchanged the lateral thyristors protect the internal circuit in cooperation with the capacitive elements while also protecting the capacitive elements so that the internal circuit is effectively protected from surge noise due to electrostatic discharge and so on, substantially in a similar manner to the foregoing. Similarly, since the capacitive elements and the lateral thyristors are formed overlying the guard ring together with the power line pair, no special region is needed exclusively for protection.

Third Embodiment

Figure 5:
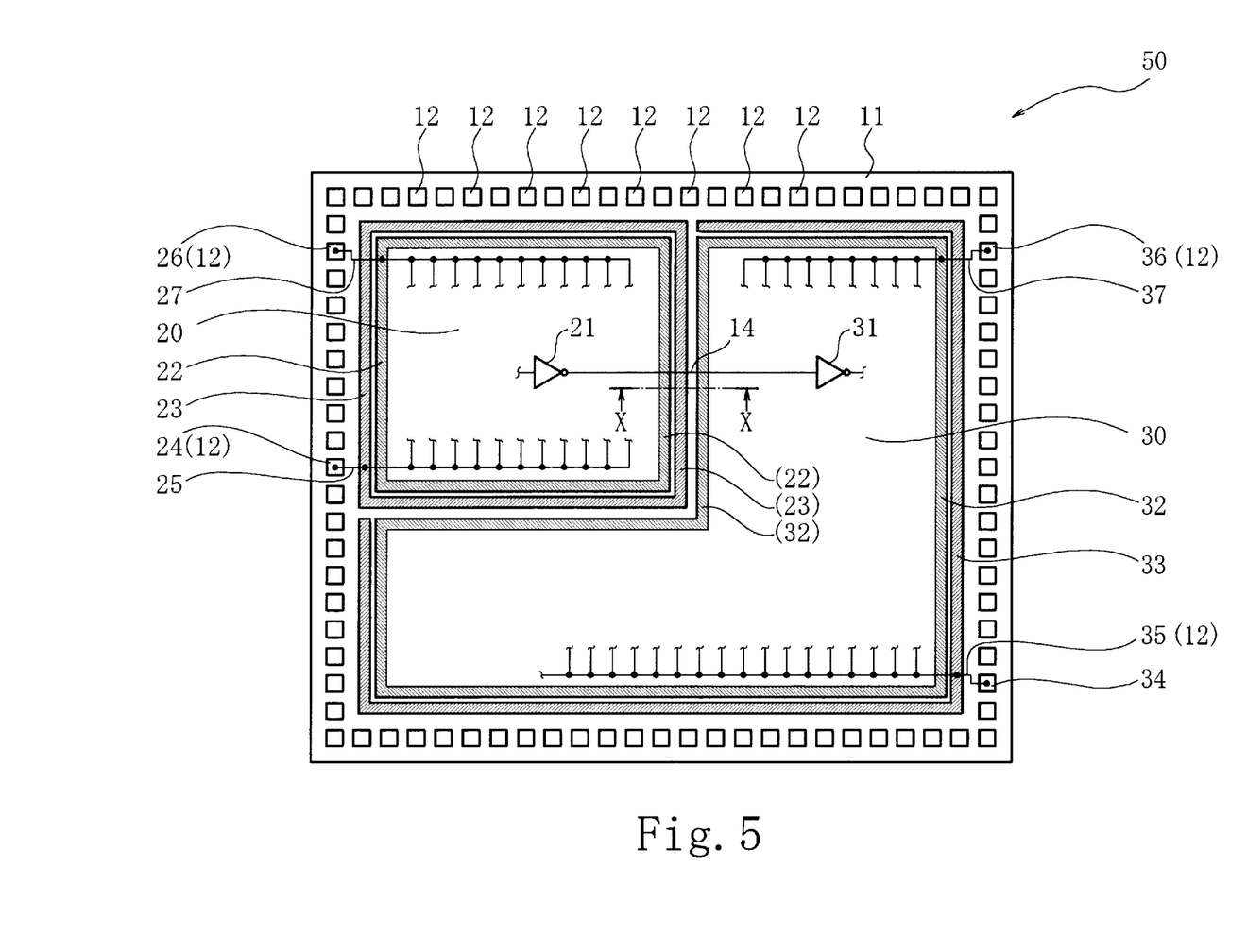
FIG. 5 is a top plan view generally illustrating the layout of a third embodiment of the semiconductor device according to the present invention.
Figure 11:
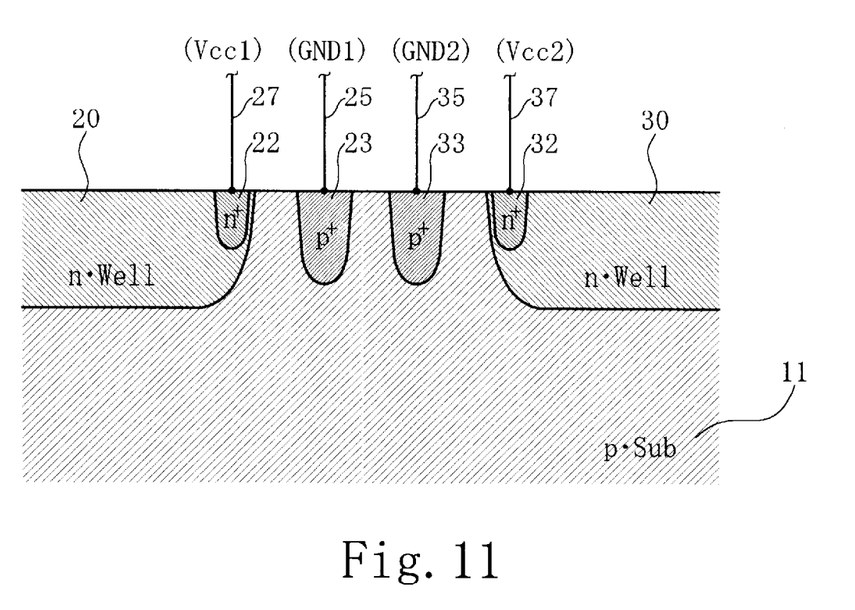
FIG. 11 is a schematic cross-sectional view of a main portion in the semiconductor device FIG. 10 (taken along a line Y—Y).

A third embodiment of the semiconductor device according to the present invention will be described in terms of its specific structure with reference to FIGS. 5 to 7. FIG. 11 is also referred to in a portion of the description.

A semiconductor device 50 (see FIG. 5) is a semiconductor integrated circuit which has a plurality of internal circuits, associated with different power lines, fabricated on one chip. For BUS example, the semiconductor device 50 may be an LSI which has a substrate 11 made of p-type silicon or the like and diced into a rectangular shape. On a main surface of the substrate 11, a plurality of external connection elements such as bonding pads 12 or the like, external signal input/output circuits, not shown, and an internal circuit are arranged in this order from a peripheral region to a central portion. A large number of pads 12 and the input/output circuits are arranged so as to surround the internal circuit along the periphery thereof Additionally, the input/output circuits are provided with input protection circuits and so on, not shown, as required.

In the semiconductor device 50, the internal circuit in this embodiment is divided into a plurality of regions, i.e., an internal circuit 20 and another internal circuit 30. Since the two internal circuits are applied with different supply voltages, and to avoid introduction of noise from the power lines, the circuits are arranged in separate left and right blocks. Also, left pads 12 positioned near the left internal circuit 20 are exclusively connected to the internal circuit 20 to relay signals associated with the internal circuit 20 to the outside, and to supply electric power to the internal circuit 20. The remaining pads 12 are exclusively connected to the internal circuit 30 to relay signals associated with the internal circuit 30 to the outside, and to supply electric power to the internal circuit 30.

With the configuration described above, the application of electric power to the left internal circuit 20 from the outside requires at least a pair of power lines. For example, a power line 27 for applying a positive voltage (Vcc1) and a power line 25 for grounding (GND1). Thus, at least one of the multiple pads 12 is used as a power supply pad 26 to which the power line 27 is connected, while at least one of the remaining pads 12 is used as a ground pad 24 to which a ground line 25 is connected. Both power lines 27, 25, which extend as annular wires and tree-like or stripe wires, though not shown, are connected to input protection circuits in input/output circuits. The power lines are routed to the internal circuit 20 through the input/output circuits and connected to a large number of internal elements such as internal element 21 in the internal circuit 20.

Although repetitive detailed description is omitted for the internal circuit 30, a power line 37 for applying another positive voltage (Vcc2) is routed from a power supply pad 36 through input/output circuits to the internal circuit 30. Power line 35 for grounding (GND2), which forms a pair with the power line 37, is likewise routed from a ground pad 34 through input/output circuits to the internal circuit 30. These power lines 35, 37 are connected to input protection circuits within the input/output circuits and internal elements such as that indicated by 31 in the internal circuit 30. All these power lines or at least power lines 27, 37 will never be connected directly or short-circuited within the semiconductor device 50. However, the power lines could be connected indirectly through a protection circuit or the like, so that the internal circuits 20, 30 act as a plurality of internal circuits associated with different power lines.

A number of wires are required for transmitting and receiving signals between the internal circuits 20, 30, such as an inter-circuit signal wire 14 for connecting the output element 21 in the internal circuit 20 to the input element 31 in the internal circuit 30. Other inter-circuit signal wires may also be required (the illustration of which is omitted) for connecting output elements in the internal circuit 30 to associated input elements in the internal circuit 20 in the reverse direction.

Figure 6:
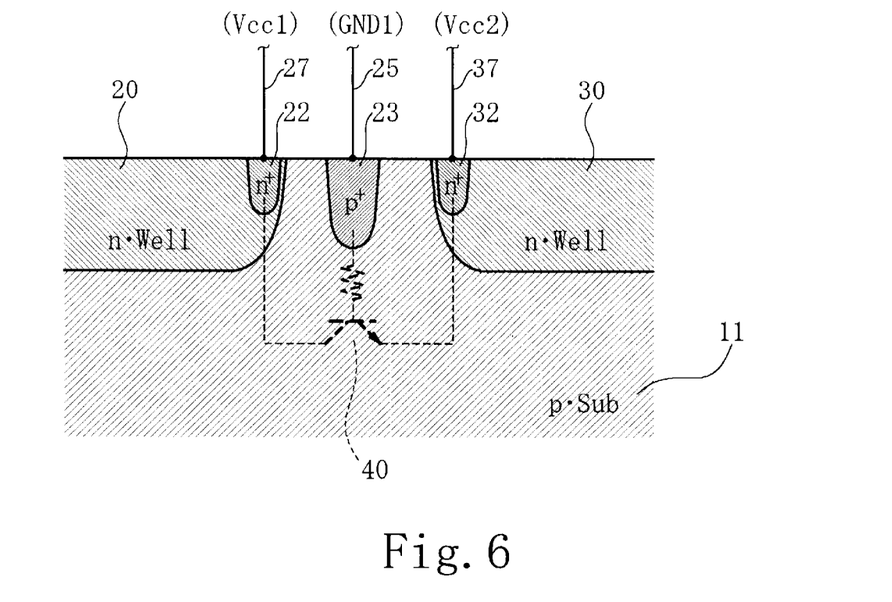
FIG. 6 is a schematic cross-sectional view of a main portion in the semiconductor device of FIG. 5 (taken along a line X—X)

As illustrated in FIGS. 6 and 11, when the substrate 11 is formed of p-type silicon (p-Sub), the internal circuits 20, 30 are fabricated in an n-type well region (n-Well). An inner guard ring 22, also referred to as a dummy collector, is formed as an annular shape region along the periphery of the well region allocated to the internal circuit 20 with the same polarity as and a higher concentration (+n) than the well region (see FIG. 6 and left half of FIG. 11). Also, on the substrate 11 immediately outside the inner guard ring 22, an outer guard ring 23 is formed as an annular shape region with the polarity identical to that of the substrate 11 and opposite to that of the well allocated to the internal circuit 20 in a higher concentration (p+) than the substrate 11.

Likewise, an inner guard ring 32 is formed as an annular shape region along the periphery of the well region allocated to the internal circuit 30 in the same polarity as and in a higher concentration (n+) than the well region (see right half of FIG. 11). An outer guard ring 33 is formed on the substrate 11 immediately outside the inner guard ring 32 as an annular shape region with the polarity identical to that of the substrate 11 and opposite to that of the well allocated to the internal circuit 30 in a higher concentration (p+) than the substrate 11.

In this way, each of the pluralities of internal circuits 20, 30 is provided with a double inner and outer guard ring (22+23), (32+33) for enhanced isolation therebetween. Each of the guard rings is connected to any appropriate power line to prevent undesirable noise from propagating through to the associated internal circuit, and to stabilize the potential states on the substrate 11 and the respective wells. Specifically, the power line 27 is connected to the inner guard ring 22. The ground line 25 is connected to the outer guard ring 23. The power line 37 is connected to the inner guard ring 32. The ground line 35 is connected to the outer guard ring 33. Furthermore, in this semiconductor device (see FIG. 5), there are four guard rings (22, 23, 33, 32) running along the sides of the internal circuit 20 and internal circuit 30, along which they do not border. There are three guard rings (22, 23, 32) running along sides of the internal circuit 20 and the internal circuit 30, along which they border, i.e., one guard ring (33) is omitted on such sides.

The adjacent internal circuits 20, 30 have different areas. The smaller one 20 is formed with double guard rings running along the entire periphery thereof. Specifically, the internal circuit 20 is formed with double inner and outer guard rings, i.e., the inner guard ring 22 and the outer guard ring 23, both of which wrap around the entire periphery of the internal circuit 20. The larger internal circuit 30 has different guard rings for the sides along which the internal circuit 30 borders the internal circuit 20, and for the remaining sides along which the internal circuit does not border the internal circuit 20. Specifically, double inner and outer guard rings, i.e., the inner guard ring 32 and the outer guard ring 33 are formed along the sides along which the internal circuit 30 does not border the internal circuit 20. The outer guard ring 33 is omitted and only the inner guard ring 32 is left along the sides along which the internal circuit 30 borders the internal circuit 20, unlike the double configuration along the boundary. A portion of the outer guard ring 33 is removed from the periphery of the internal circuit 30 on the sides along which the internal circuits 20, 30 border each other. The guard ring along the internal circuit 30 is thinner on the removed sides than those formed along the sides along which the internal circuit 30 does not border the internal circuit 20.

Figure 7:
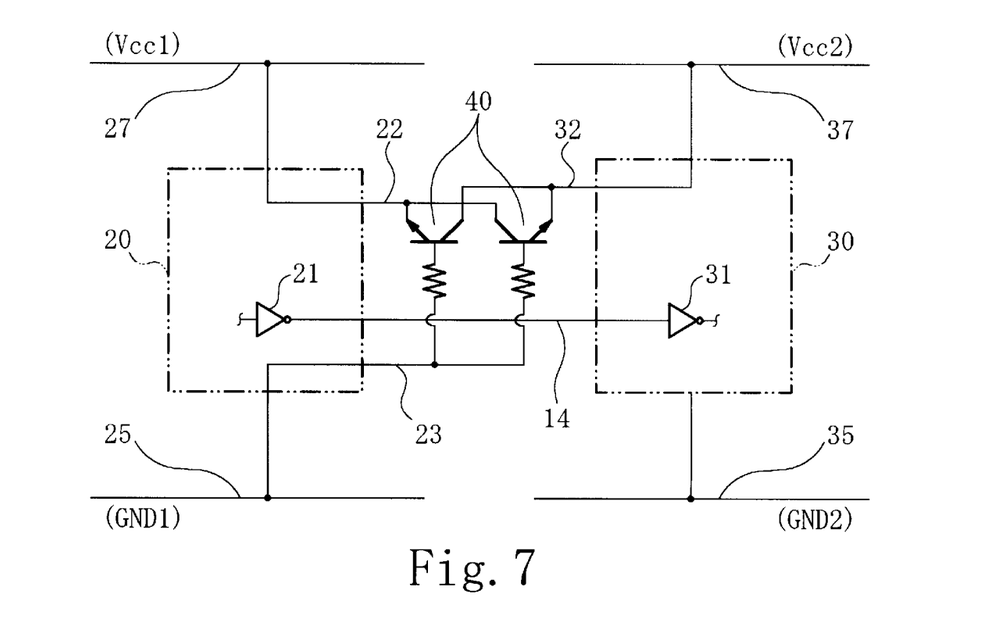
FIG. 7 is an equivalent circuit diagram for the main portion illustrated in FIG. 6.

Referring now to FIG. 6 and 7, the removal of the outer guard ring 33 results in a reduced distance between the inner guard ring 22 and the inner guard ring 32, and enlarges the effective areas allocated to the internal circuit 30 and internal circuit 20 in a similar manner. In addition, a bipolar-type parasitic lateral transistor 40 (i.e., active element for enhanced protection) comprises the inner guard ring 22 as a collector or an emitter, the outer guard ring 23 as a base and the inner guard ring 32 as an emitter or a collector that has a lower threshold voltage. Thus, with appropriate distance selection, a voltage at which the parasitic lateral transistor 40 is actuated or is punched through can be set lower than the breakdown voltage of the internal elements 21, 32 and so on, and higher than the proper supply voltages Vcc1, Vcc2 with almost no modification to any structures of the respective guard rings 22, 23, 32 in the cross section. Thus, only by doing so in designing the layout, this causes the parasitic lateral transistor 40 to have the collector or emitter connected to the well region allocated to the internal circuit 20 and the power line 27 associated therewith. The well region is then allocated to the internal circuit 30 and the power line 37 is associated therewith, and the base is connected to the ground line 25, as can be seen in FIG. 7.

Next, the semiconductor device 50 of the third embodiment will be described in terms of its usage and operation.

The semiconductor device 50, configured as described above, is applied with a predetermined positive voltage (Vcc1) at the power supply pad 26 from an external appropriate power supply, and has the ground pad 24 connected to a predetermined ground potential (GND1) to operate the internal circuit 20. The semiconductor device 50 is also applied with a predetermined positive voltage (Vcc2) at the power supply pad 36 from another external power supply, and has the ground pad 34 connected to a predetermined ground potential (GND2) to operate the internal circuit 30.

In a situation where fluctuations in the supply voltages are limited within a tolerable range to provide the proper supply voltages, the parasitic lateral transistor 40 is off, so that the internal circuit 20 is isolated from the surroundings for protection by reverse biasing of the inner guard ring 22 and the outer guard ring 23. The internal circuit 30 is also isolated from the surroundings for protection by reverse biasing of the inner guard ring 32, the outer guard ring 33 and the outer guard ring 23, with the result that the internal circuits 20, 30 normally operate.

However, if an abnormal voltage is applied to either of the internal circuits or a power line associated therewith through any pad 12 to cause a potential difference between the well regions allocated to the internal circuits 20, 30 or a potential difference between the well regions allocated to the internal circuits 20, 30 or the power lines (27, 25), (37, 35) associated therewith to increase beyond an appropriate range, a base-emitter potential difference of the parasitic lateral transistor 40 is extended to the accompaniment thereof, and the parasitic lateral transistor 40 is turned on in response to the extended base-emitter potential difference. Alternatively, the collector-emitter potential difference of the parasitic lateral transistor 40 is extended to cause punch-through there.

In this way, since an abnormal voltage applied to any of the internal circuits 20, 30 is accompanied by a circuit voltage applied to the other one, even if the internal circuit 20 or 30 is applied with an abnormal voltage exceeding the breakdown voltage of the internal element 21 or 31, the potential difference between both ends of an inter-circuit signal wire 14 is limited so as not to exceed the breakdown voltage thereof, thereby making it possible to avoid breakdown of the internal element 21 or 31 with an inter-block protection circuit, as a matter of course, or even without it. Moreover, the chip size can be reduced by the removed portion of the outer guard ring 33, and even more if the inter-block protection circuits are also removed. Alternatively, with the same chip size maintained, larger areas can be allocated to the internal circuits 20, 30.

Fourth Embodiment

Figure 8:
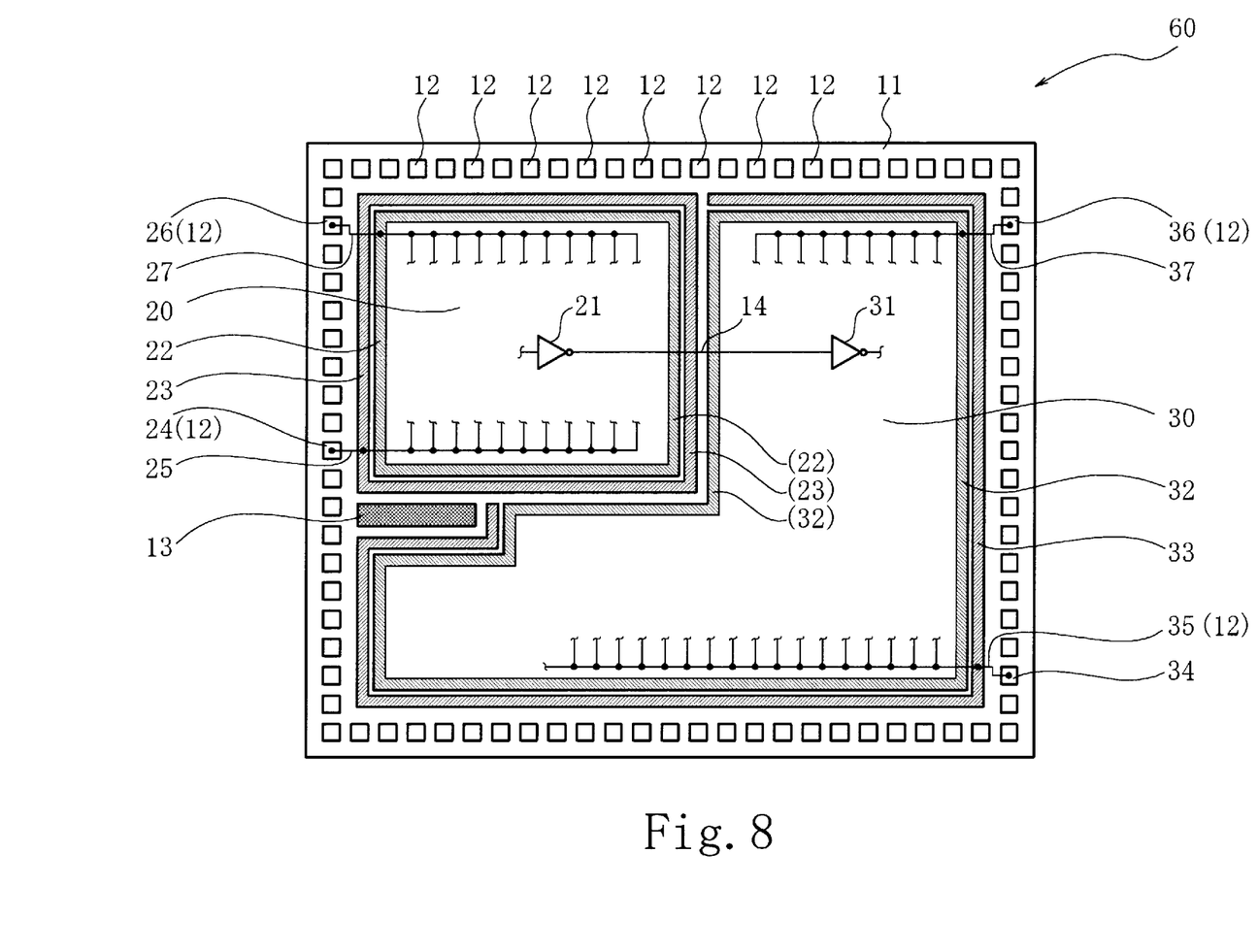
FIG. 8 is a top plan view generally illustrating the layout of a fourth embodiment of the conductor device according to the present invention.
Figure 9:
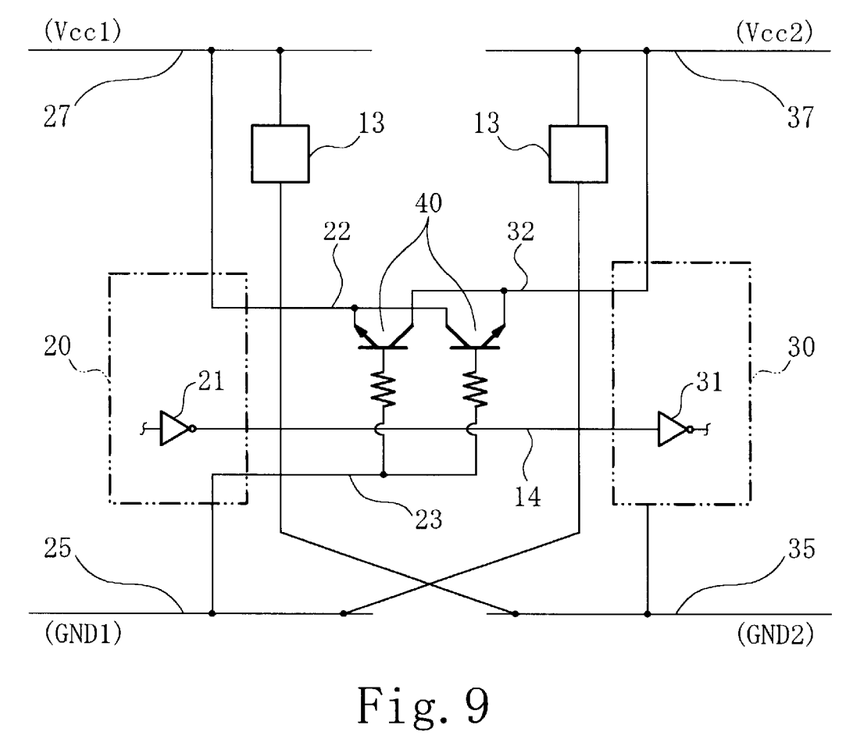
FIG. 9 is an equivalent circuit diagram for a main portion in the semiconductor device stated in FIG. 8.

A fourth embodiment of the semiconductor device according to the present invention will be described in terms of its specific structure with reference to FIGS. 8 and 9.

An illustrated semiconductor device 60 differs from the aforementioned semiconductor device 50 in that an inter-block protection circuit 13 is explicitly provided, and an outer guard ring 33 is extended around the inter-block protection circuit 13, to the accompaniment of the provision of the inter-block protection circuit 13. The outer guard ring 33 is still removed along the sides along which the internal circuit 20 borders the internal circuit 30, and internal elements 21, 31 are connected through an inter-circuit signal wire 14 and positioned on both sides of the boundary.

The inter-block protection circuit 13, which may be comprised of resistors, rectifying elements, zener diodes or transistors having similar functions, is located in an appropriate dedicated region, and is also connected to a pair of a power line 27 and a ground line 35 or to a pair of power line 37 and a ground line 25. The protection circuit 13 may be implemented by a conventional one that has been used in many cases, and is used in combination with a parasitic lateral transistor 40.

The parasitic lateral transistor 40 and the protection circuit 13 differ in details of their respective operation starting conditions and timing, and exhibit advantages and disadvantages in particulars, depending on the positions at which internal elements are placed in the internal circuits, and so on. However, since the two components work in parallel, only their advantages become prominent. Further, even if the protection circuit 13 is included again as before, the area dedicated to the protection circuit is not increased more than the conventional protection circuit. A required area is reduced at least by the removed portion of the outer guard ring 33.

This ensures to enhance the protection from electrostatic breakdown.

Fifth Embodiment

A fifth embodiment of the semiconductor device according to the present invention will be described in terms of its specific structure with reference to FIGS. 10 and 11. FIG. 6 is also referred to in a portion of the description.

Figure 10:
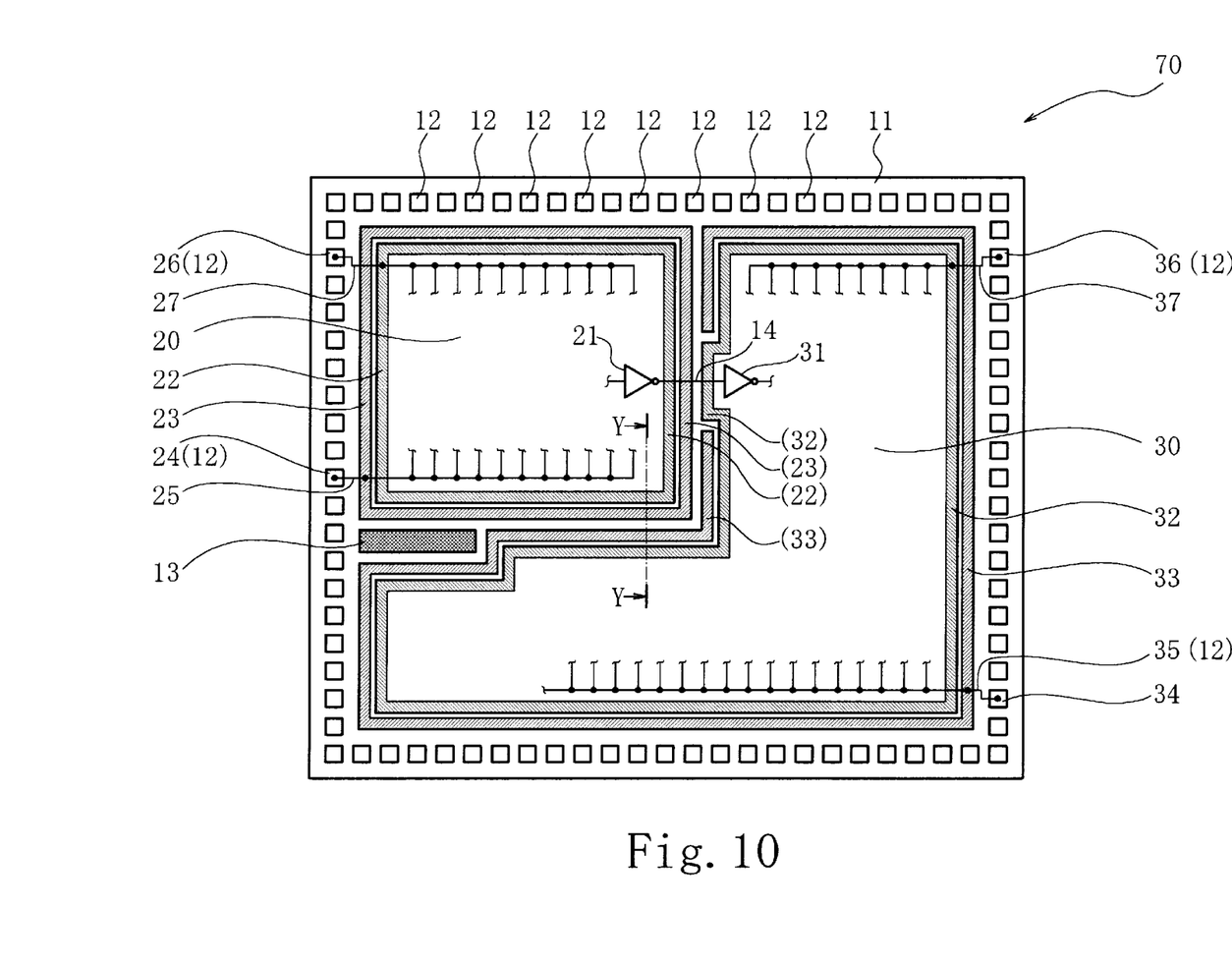
FIG. 10 is a top plan view generally illustrating the layout of a fifth embodiment of the semiconductor device according to the present invention.

Referring to FIG. 10, an illustrated semiconductor device 70 differs from the aforementioned semiconductor device 60 in that internal elements 21, 31 connected through an inter-circuit signal wire 14 are moved to locations in respect to the internal circuits 20, 30 being closer to the boundary. A removed range of an outer guard ring 33 is limited to an extent corresponding to the area of the internal element 31 beneath the inter-circuit signal wire 14.

Specifically, referring to FIGS. 10 and 6, a portion of an inner guard ring 32 protrudes into the region from which the outer guard ring 33 is removed, and the internal element 31 is positioned such that a portion thereof is fitted in the protrusion. Then, the internal element 21 is positioned to be closest possible to the internal element 31 across the protruding inner guard ring 32, the outer guard ring 23 and the inter guard ring 22. Any other inter-circuit signal wire, not shown, and internal elements connected therethrough, if any, may be positioned in a similar manner, and sequentially arranged as far as possible along the boundary.

Referring now to FIGS. 10 and 11, double inner and outer guard rings (22+23), (32+33), provided for each of a plurality of internal circuits 20, 30 for enhanced isolation therebetween, run along the sides where the internal circuit 20 borders the internal circuit 30 except for the region where the outer guard ring 33 is removed.

In this structure, portions which cannot be released from mutual dependency due to a signal transmission and reception are limited to or concentrated in a portion of adjacent regions of the internal circuits 20, 30. The isolation between the internal circuits is mitigated limiatatively in this portion. Whereas, sufficient isolation is ensured for the remaining regions which are free from such mutual dependency. Thus, it is possible to ensure the protection of the internal circuits 20, 30 from electrostatic breakdown, even when resulting from the existence of an inter-circuit signal wire, without damaging the advantages of the configuration in which the respective internal circuits are operated with different power supply systems that are independent of each other.

Other Embodiments

In the respective embodiments described above, although detailed structures in the internal circuits are omitted, the present invention can be applied to any semiconductor device having internal circuits including such elements as FETs of pMOS-, NMOS-, MNOS-type, or any other type, not limited to the aforementioned CMOS FET. In addition, the internal circuits may include a mixture of these FETs or include bipolar transistors, and may be digital or analog circuits.

The number of internal circuits is not limited to two, but may be three or more. The internal circuits are not limited in location, so that they may be arranged on any side, not limited to left and right sides.

The guard rings are not limited to the triple one but may be double or less, or also quadruple or more, and may not completely wrap around an associated internal circuit.

The power lines are not limited to a pair of power lines, one for applying a positive voltage and one for grounding. Alternatively, a variety of combinations are contemplated for the power lines, for example, a pair of positive and negative voltages; a set of positive and negative voltages and the ground; a set of a higher voltage, a lower voltage and another reference voltage, and so on.

The connection between the two blocks is not limited to a set of internal elements 21, 31, but a plurality of sets of internal elements may be provided without any limitation to the direction in which signals are transmitted and received.

Further, while the foregoing embodiments have shown a p-type substrate, the substrate is not limited to the p-type one, but may be an n-type one or an insulating one. Furthermore, the substrate is not limited to that made of silicon, but may be made of gallium arsenide (GaAs) or the like.

Also, while the foregoing embodiments have been described for a structure in which the capacitive elements 8, lateral thyristors 9, and power lines 81, 82 are all formed overlying the guard ring 7. The condition for such overlying formation is not critical, so that some of them may be displaced to some degree, as long as they are generally formed along the guard ring 7. While in the foregoing embodiments, the capacitive elements 8 formed together with the guard ring 7 are all connected to the power line pair 81+82 and used for ESD protection, the use of the capacitive elements 8 is not limited to the ESD protection, and some or certain proportion of the multiple capacitive elements 8 arranged in columns may be used for any other appropriate purposes. For example, alternating capacitive elements or an appropriate number of capacitive elements may be selected and connected to other portions in an internal circuit 6 where the capacitive elements 8 are required instead of the power line pair 81+82. In this case, the capacitive elements 8 may be connected to a region as far as possible from connections of pads 3, 5, 2 with power lines 81, 82.

In essence, as will be apparent from the foregoing description, the area allocated to the guard ring is utilized to protect the internal circuits in a double or multiplicative manner, so that the internal circuits can be strongly protected from electrostatic breakdown and so on without increasing the area occupied by the protection circuits or while limiting an increase in the occupied area. Consequently, it is possible to realize a semiconductor device resistant to electrostatic breakdown.

Also, since the lateral thyristors are made parasitic to the capacitive elements, the area occupied by the protection circuits is further saved, thereby making it possible to realize a compact semiconductor device resistant to electrostatic breakdown.

Further, since the capacitive elements are protected by the lateral thyristors without fail, it is possible to realize a compact semiconductor device more resistant to electrostatic breakdown.

Further, since the capacitive elements, lateral thyristors and power lines, in addition to the guard rings, surround the internal circuits, and the capacitive elements and the lateral thyristors can be operated in respective unit elements to reliably protect the entirety of the internal circuits, thereby making it possible to realize a semiconductor device resistant to electrostatic breakdown.

Further, in the semiconductor device of the present invention, an abnormal voltage, if any, is divided or shared by internal circuits bordering by way of the narrower guard rings, so that a potential difference and a breakdown force produced at both ends of an inter-circuit signal wire are mitigated. Consequently, it is possible to realize a semiconductor device resistant to electrostatic breakdown without increasing the area occupied by the protection circuits.

Also, since the number of guard rings is adjusted to reduce the width of the guard rings, a semiconductor device resistant to electrostatic breakdown can be readily realized without increasing the area occupied by the protection circuits.

In addition, since the number of guard rings along which internal circuits border each other is adjusted without reducing a lower limit to ESD resistance possessed by a single internal circuit, the protection of a plurality of internal circuits against ESD is enhanced without any sacrifice caused thereby, making it possible to readily and reliably realize a semiconductor device resistant to electrostatic breakdown without increasing the area occupied by the protection circuits.

It will be apparent to those skilled in the art that various modifications and variations can be made in the semiconductor device of the present invention without departing from the spirit or scope of the invention. Thus, it is intended that the present invention cover modifications and variations of this invention provided they come within the scope of the appended claims and their equivalents.

What is claimed is:

1. A semiconductor device comprising:
   a one-chip substrate having a circuit formation region allocated on one surface thereof;
   a plurality of external connection terminals arranged on said one surface outside said circuit formation region;
   an internal circuit provided in said circuit formation region;
   a power line connected to one of said external connection terminals and to said internal circuit;
   a guard ring formed in said circuit formation region to surround said internal circuit;
   active elements formed parasitic to said guard ring, formed along said guard ring, formed overlying said guard ring, and connected to said power line, each of said active elements being operable to maintain a blocking state when a voltage applied from said power line is equal to or lower than a proper operating voltage for said internal circuit, and each of said active elements being operable to become conductive when said applied voltage exceeds said proper operating voltage for said internal circuit before said applied voltage reaches a breakdown voltage of said internal circuit; and
   capacitive elements formed parasitic to said guard ring, formed along said guard ring, formed overlying said guard ring, and connected to said power line.

2. A semiconductor device according to claim 1, wherein said active elements are lateral thyristors.

3. A semiconductor device according to claim 2, wherein said power line comprises a pair of lines.

4. A semiconductor device according to claim 3, wherein said lateral thyristors are connected to one line of said power line pair in a portion of a semiconductor region in which said capacitive elements are connected to one line of said power line pair.

5. A semiconductor device according to claim 4, further comprising a wiring layer extending from a connection to one of said lateral thyristors with the other line of said power line pair being connected to one of said capacitive elements after passing over an electrode layer of one of said capacitive elements.

6. A semiconductor device according to claim 5, wherein said power lines are formed along said guard ring.

7. A semiconductor device according to claim 6, wherein said power lines are formed overlying said guard ring with an insulating layer interposed therebetween.

8. A semiconductor device according to claim 2, wherein said capacitive elements and said lateral thyristors are formed such that they are divided into many blocks.

9. A semiconductor device according to claim 1, wherein said internal circuit includes a MOS transistor, and said capacitive elements comprise an intermediate insulating layer including a film having the same structure as that of a gate insulating film of said MOS transistor.

10. A semiconductor device comprising:
    a one-chip substrate having a circuit formation region allocated on one surface thereof;
    a plurality of external connection terminals arranged on said one surface outside said circuit formation region;
    internal circuits provided in said circuit formation region;
    a plurality of power lines arranged on said one surface, each of said power lines is connected to one of said external connection terminals and to one of said internal circuits respectively;
    an inter-circuit signal wire extending between said internal circuits;
    a plurality of guard rings formed in said circuit formation region, each of said guard rings is surrounding each of said internal circuits; and
    active elements formed parasitic to said guard ring, and connected to said power line, each of said active elements being operable to maintain a blocking state when a voltage applied from said power line is equal to or lower than a proper operating voltage for said internal circuit, and each of said active elements being operable to become conductive when said applied voltage exceeds said proper operating voltage for said internal circuit before said applied voltage reaches a breakdown voltage of said internal circuits; wherein said active elements positioned near a side of each of said internal circuits along which said internal circuits border each other.

11. A semiconductor device according to claim 10, wherein said active elements are lateral transistors.

12. A semiconductor device according to claim 11, wherein at least one of said guard rings has a variable width wherein said variable width is smaller near a portion where said lateral transistors are formed, and wider near a portion along the sides of said internal circuits where said internal circuits do not border each other.

13. A semiconductor device according to claim 12, wherein at least one of said guard rings is formed of multiple guard ring elements.

14. A semiconductor device according to claim 13, wherein one of said multiple guard ring elements is removed along the sides of said internal circuits along which said internal circuits border each other.

15. A semiconductor device according to claim 14, wherein one of said multiple guard ring elements is removed along the sides of said internal circuits along which said internal circuits border each other.

16. A semiconductor device according to claim 14, wherein one of said multiple guard ring elements is removed along a portion of the sides of said internal circuits along which said internal circuits border each other.

17. A semiconductor device according to claim 13, wherein said inter-circuit signal wire passes over said portion of the sides of said internal circuit along which one of said multiple guard ring elements is removed.

18. A semiconductor device according to claim 17, further comprising a pair of internal elements for transmitting and receiving a signal through said inter-circuit signal wire, wherein said pair of internal elements are disposed on both sides of the portion of the side of said internal circuits along which one of said multiple guard ring elements is removed.

19. A semiconductor device according to claim 14, wherein one of said multiple guard ring elements is removed from said guard ring associated with one of said internal circuits having the largest area between bordering internal circuits.

20. A semiconductor device according to claim 19, wherein said guard ring wraps around one of said bordering internal circuits having a smaller area than the other said bordering internal circuits.

21. A semiconductor device according to claim 20, wherein one of said multiple guard ring elements is removed along the entire side of said internal circuits along which said internal circuits border each other.

22. A semiconductor device according to claim 20, wherein one of said multiple guard ring elements is removed along a portion of the sides of said internal circuits along which said internal circuits border each other.

23. A semiconductor device according to claim 20, wherein said inter-circuit signal wire passes over a portion of said internal circuits along which one of said multiple guard ring elements is removed.

24. A semiconductor device according to claim 23, further comprising a pair of internal elements for transmitting and receiving a signal through said inter-circuit signal wire, wherein said pair of internal elements are disposed on both sides of the portion of the side of said internal circuits along which one of said multiple guard ring elements is removed.

* * * * *